United States Patent [19]

Hsue

[11] Patent Number: 5,434,099
[45] Date of Patent: Jul. 18, 1995

[54] METHOD OF MANUFACTURING FIELD ISOLATION FOR COMPLIMENTARY TYPE DEVICES

[75] Inventor: Chen-Chih Hsue, Hsin, Taiwan

[73] Assignee: United Microelectronics Corporation, Hsinchu, Taiwan

[21] Appl. No.: 270,769

[22] Filed: Jul. 5, 1994

[51] Int. Cl.[6] .............................................. H01L 21/76
[52] U.S. Cl. .......................................... 437/70; 437/57
[58] Field of Search ...................................... 437/70, 57; 148/DIG. 85, DIG. 86, DIG. 17

[56] References Cited

U.S. PATENT DOCUMENTS

| | | | |
|---|---|---|---|
| 31,079 | 11/1882 | Nagasawa et al. | 29/571 |
| 4,306,916 | 12/1981 | Woclesen et al. | 437/70 |
| 4,412,375 | 11/1983 | Matthews . | |
| 4,435,895 | 3/1984 | Pardilo et al. . | |
| 4,717,683 | 1/1988 | Parrillo et al. | 437/34 |
| 4,728,619 | 3/1988 | Pfiester et al. | 437/70 |
| 4,743,565 | 5/1988 | Pfiester et al. | 437/24 |
| 4,839,301 | 6/1989 | Lee | 437/70 |
| 4,847,213 | 7/1989 | Pfiester | 437/24 |
| 5,086,012 | 2/1992 | Sik | 437/70 |
| 5,141,882 | 8/1992 | Komari et al. | 437/34 |

FOREIGN PATENT DOCUMENTS

| | | |
|---|---|---|
| 58-218161 | 12/1983 | Japan . |
| 61-292036 | 10/1986 | Japan . |
| 2118364 | 10/1983 | United Kingdom . |

*Primary Examiner*—George Fourson
*Attorney, Agent, or Firm*—George O. Saile; Wolmar J. Stoffel

[57] ABSTRACT

The method requires fewer process steps. A nitride layer and a first overlying photoresist are deposited on a semiconductor substrate having wells of different impurity types. The resist layer is developed and to cover first type well and the device area of the opposite second type well. After the resultant exposed nitride layer is removed, impurity ions are implanted. The first photoresist layer is removed and a second photoresist layer deposited. The second resist layer is deposited and developed to cover the second well and the device area in the first well. The resultant exposed nitride areas are removed and ions implanted. The second photoresist layer is removed and the substrate oxidized to form field oxide regions. The nitride layer is removed and the substrate completed by forming devices, passivation layers and metallurgy.

11 Claims, 2 Drawing Sheets

METHOD OF MANUFACTURING FIELD ISOLATION FOR COMPLIMENTARY TYPE DEVICES

BACKGROUND OF THE INVENTION

1. Field of the Invention

The present invention relates to method of manufacturing complimentary field effect transistor devices (CMOS), and more particularly to form field isolation for CMOS that requires fewer process steps.

2. Description of the Invention

The conventional method of manufacturing a semiconductor substrate having P and N wells, and field oxide isolation regions electrically isolating the wells, is described and claimed in U.S. Pat. No. RE31,079. In this method, the P and N wells are formed in a semiconductor substrate. A pad oxide layer and an overlying layer of silicon nitride are deposited on the substrate and a first resist mask is deposited, exposed and developed to define the field oxide regions. These regions are opened up in the underlying oxide and nitride layers. A second resist layer is deposited, exposed and developed to cover one of the wells. Ions are implanted in the defined field oxide regions in the exposed well region using the oxide and nitride layers as a mask. After the second resist layer is removed, a thin resist layer is deposited, exposed and developed to cover the opposite well area, and opposite type ions implanted through the defined field oxide region openings in the oxide and nitride layers. Subsequently the third resist layer is removed and the substrate is exposed to an oxidizing environment to form field oxide regions in the openings in the nitride layer. The oxide layer and nitride layers are removed and the substrate further processed to form a complimentary metal over silicon devices, Note that the process requires three separate masking steps.

U.S. Pat. No. 5,141,882 to Komori et al, describes a process for forming a similar device structure. This process requires many masking operations. U.S. Pat. No. 5,086,012 to Sik also describes techniques for fabricating field oxide regions on substrates provided with N and P type wells. However, the patent also requires three or more steps and uses a thick deposited oxide rather than a thermally grown field oxide.

In semiconductor fabrication, each operation adds to the final cost of the device produced, and also presents the potential for reducing the yield. Thus, it is desirable to reduce the number of process operations in order to reduce cost and increase the yield. All of the prior art fabrication techniques use a least three or more masking operations to form field oxide isolation regions complete with channel inversion layers beneath the isolation regions in applications requiring N and P wells, as in complimentary type devices.

SUMMARY OF THE INVENTION

An object of the invention is to reduce the number of process steps in the fabrication of an integrated semiconductor device.

Another object of the invention is to reduce the cost and increase the yield of fabricating integrated semiconductor devices.

Yet another object of the invention is to reduce the number of masking steps in a fabrication process of manufacturing complimentary metal over silicon devices.

In accordance with the aforementioned objectives, there is provided an improved method of fabricating a thick field oxide on a substrate having N and P type wells. In the method a pad oxide and a silicon nitride layer are deposited on a semiconductor substrate provided with adjacent P and N type wells. A first photoresist layer is deposited, exposed, and developed to cover a first one of the wells, and overlies the device area in the second of the wells. The exposed silicon nitride layer areas are removed, and ions of the same type implanted into the exposed areas of the second well. After the first photoresist layer is removed, a second photoresist layer is deposited on the substrate, exposed and developed to cover the second of the wells, and the device area in the first of the wells. The exposed silicon nitride layer is removed and ions of the same type as the first well are implanted. The second photoresist is then removed and the substrate subjected to an oxidizing environment to grow silicon oxide field regions in the area not covered by the silicon nitride layer. The silicon nitride layer is removed and the substrate is further processed to form the desired circuitry.

DESCRIPTION OF PREFERRED EMBODIMENTS

Figure 1:
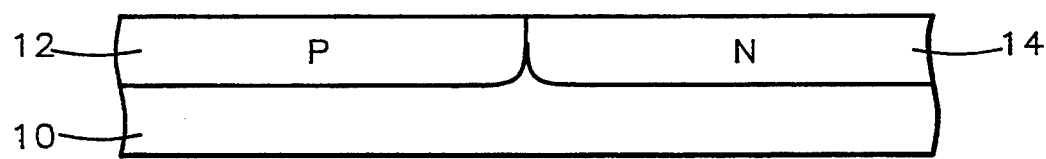
FIGS. 1-6 is a sequence of cross sectional views, in broken section, in greatly enlarged scale, that illustrate a preferred embodiment of the method of the invention.

Referring now to the figures of the drawing, there is illustrated the structures of a device at various stages of the process of the invention. FIG. 1 illustrates a monocrystalline semiconductor substrate 10 which is in the starting point of the process of the invention. Substrate 10 can be any semiconductor material, but is preferably a monocrystalline silicon substrate with a surface crystalline plane of <100>, as defined by the Miller indices. The substrate 10 is shown with a P well 12, and an N well 14, which can be produced by well known techniques, such a diffusion or ion implantation. Alternatively, one of the wells can be the substrate or an optional layer that embodies an N or P type background impurity for semiconductors, and the other well can be a region of the opposite type impurity that has been introduced into the substrate.

Figure 2:
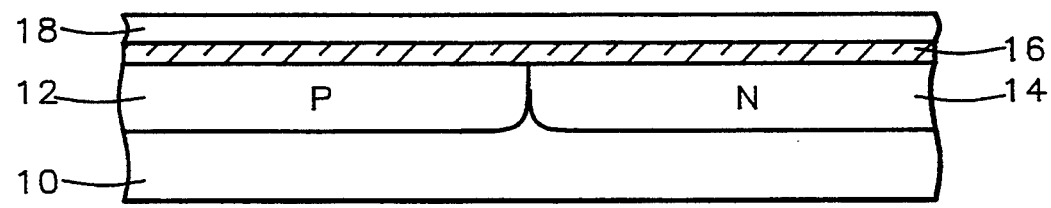

As shown in FIG. 2, a pad oxide layer 16 is deposited on substrate 10, followed by an oxidation resistant layer 18, normally a silicon nitride layer. The pad oxide layer 16 is provided to buffer the field oxidation stress generated by nitride layer. Layer 16 can be formed of $SiO_2$, oxynitride. Layer 16 is preferably $SiO_2$, and has a thickness in the range of 100 to 400 Angstroms. The layer 16 can be formed by oxidizing a silicon substrate in a steam atmosphere, at a temperature in the range of 800° to 1000° C., for a time in the range of 10 to 60 minutes. Layer 18 must be resistant to oxidation because it will later in the process be used to cover device areas as the field oxide regions are formed by oxidizing the substrate. Preferably layer 18 is silicon nitride with a thickness in the range of 1000 to 3000 Angstroms. Silicon nitride can de deposited by exposing the wafer to $NH_3$, $SiH_2Cl_2$ gas at low pressure chemical wafer deposition (LPCVD), at 820° C.

Figure 3:
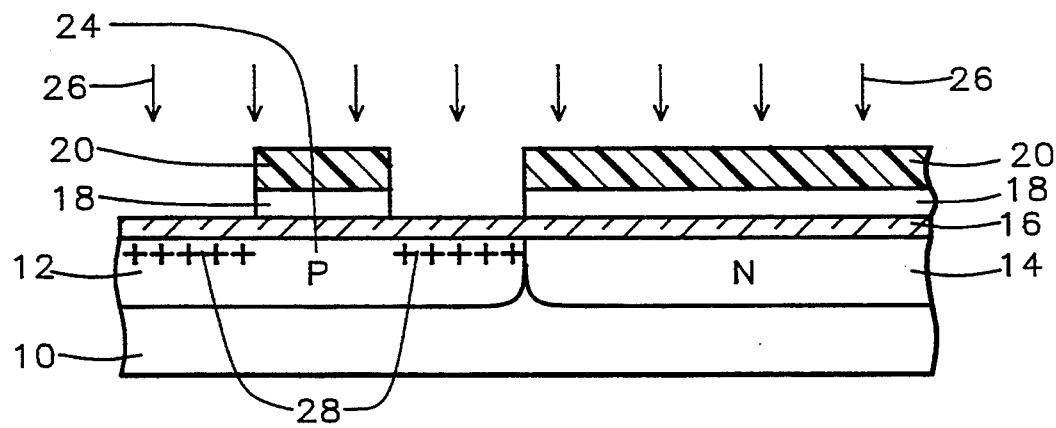

As shown in FIG. 3, a first photoresist layer 20 is deposited over layer 18. Layer 20 is then exposed and developed to completely cover one of the wells. The well 14 is shown covered. Also the resist 20 is formed to cover the area 24 over the other well 12 that will eventually be the device area, i.e. a silicon area that is to be dedicated to one or more semiconductor elements. The exposed portions of nitride layer 18 are then removed with a suitable etch, such as a SFe Plasma Etcher. Subsequently the substrate is subjected to an ion implantation of impurity ions as indicated by arrows 26. The impurity ions are chosen to be the same type as the underlying well with the area exposed. In FIG. 3, positive type ions 28, such as Boron are implanted in P type well 12. $B^+$ or $BF_2^+$ ions are implanted with a sufficiently high voltage to penetrate the substrate 10 a short distance, but not high enough to penetrate the masking layers, i.e. layers 16, 18 and 20, over well 14. Typically, Boron ions are implanted at an acceleration voltage in the range of 30 to 80 Kev with a dosage in the range of 1E12 to 1E13.

Figure 4:
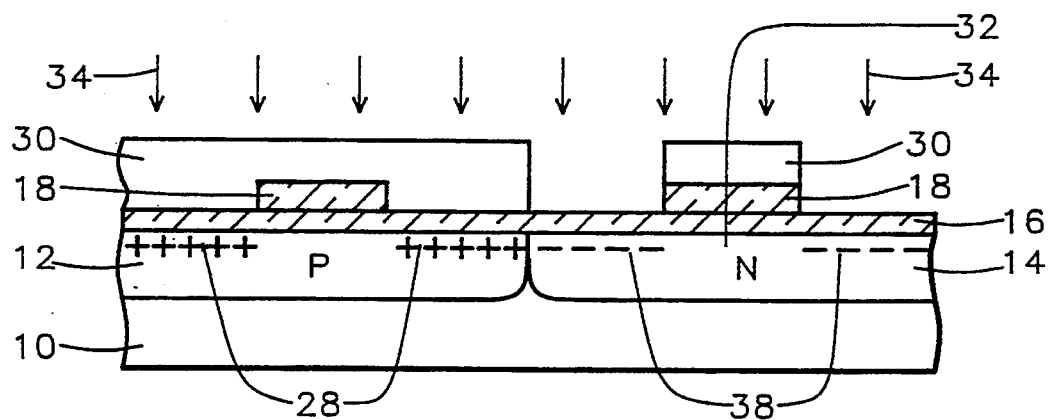
Figure 5:
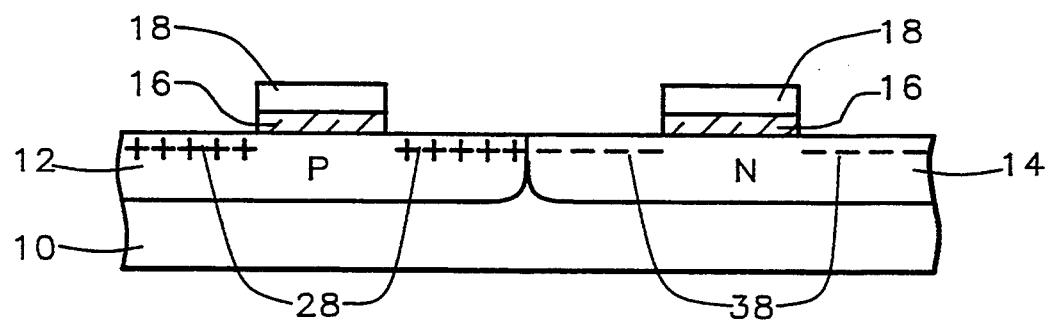

As indicated in FIG. 4, the resist layer 20 is removed and a second resist layer 30 deposited. Layer 30 is exposed and developed to cover well 12 and the potential device area 32 over well 14. Impurity ions of the same type as the exposed underlying well are again implanted into the substrate 10 as indicated by arrows 34. In FIG. 4, negative impurity ions 38 are shown in implanted N well 14. Suitable impurities are Arsenic or Phosphorus. These impurities are implanted with sufficient voltage to penetrate the substrate a short distance. The N type ions are typically implanted at an acceleration voltage in the range of 30 to 80 Kev with a dosage in the range of 1E12 to 1E13. As shown in FIG. 5, the photoresist layer 30 is removed leaving the layers 16 and 18 over the device areas of wells 12 and 14. The substrate is subsequently exposed to an oxidizing environment that will form thick $SiO_2$ field oxide regions 40 in the exposed areas of the substrate. The exposed silicon areas can be oxidized by subjecting the substrate to an $H_2/O_2$ ambient in a furnace heated to a temperature in the range of 900° to 1150° C., for a time in the range of 2 to 10 hours.

The $SiO_2$ regions 40 preferably have a thickness in the range of 4000 to 8000 Angstroms. Note that the implanted ions 28 and 38 are pushed down into the substrate ahead of the oxide as it is formed, thus providing a higher impurity concentration beneath the oxide regions. This prevents inversion of the regions and current leakage. The nitride layer 18 and underlying $SiO_2$ layer 16 area are then removed and the substrate completed by forming devices, passivation layers, and metallurgy using well known prior art techniques.

Figure 6:
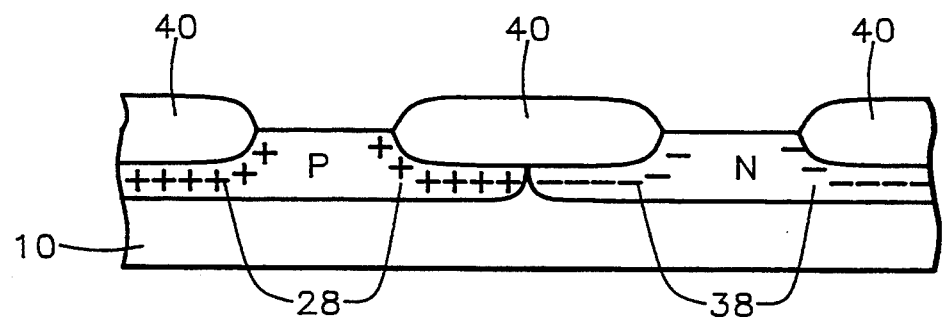

Obviously, modifications in the base process can be made without departing from the invention concept. For example, different materials can be substituted for the various materials suggested. Also the exposed areas of the substrate could be etched before oxidation forming areas 40 to remove a portion of the substrate. Then when the substrate is oxidized, as in FIG. 6, the surfaces of the device areas and oxide regions could be maintained at the same level.

The aforedescribed process for forming field oxide isolation in a substrate having opposite type wells requires only two masking steps. In contrast, note that the comparable prior art processes all require three or more steps to achieve the same objective. This reduction in masking steps reduces the cost of the product and increases the yield.

What is claimed is:

1. A method of manufacturing field oxide regions on a semiconductor substrate having a P well and an N well comprising:

forming a pad oxide layer on the surface of said substrate that overlies both wells;

forming a silicon nitride layer over said oxide layer;

depositing, exposing and developing a first photoresist layer over said oxide layer that completely masks a first of said wells, and overlies only the device area in the second opposite of said wells;

removing the resulting exposed areas of the silicon nitride layer and, implanting impurity ions of the same type as the background impurity in said second well using said first developed photoresist layer as a mask;

removing said first photoresist layer;

depositing, exposing and developing a second photoresist layer over said substrate that completely masks the said second well and overlies only the device area in the said first well;

removing the resulting exposed areas of the silicon nitride layer;

implanting ions of the same type as the background impurity in said second well through the exposed areas of said second photoresist layer;

removing said second photoresist layer;

thermally oxidizing the resulting exposed portions of the substrate resulting in field oxide regions with underlying inversion preventing regions in the areas not covered by said silicon nitride layer, and removing said silicon nitride layer and said oxide layer.

2. The method of claim 1 wherein said pad oxide has a thickness in the range of 100 to 400 Angstroms.

3. The method of claim 2 wherein said silicon nitride layer has a thickness in the range of 1000 to 3000 Angstroms.

4. The method of claim 1 wherein said first of said wells has a background P type impurity.

5. The method of claim i wherein said first of said wells has a background N type impurity.

6. The method of claim 1 wherein the thermal oxidation is achieved by a thermal furnace.

7. The method of claim 6 wherein said field oxide regions have a thickness in the range of 4000 to 8000 Angstroms.

8. The method of claim 4 wherein said implanted P type impurity ion is Boron.

9. The method of claim 8 wherein said P impurity ion is implanted at an acceleration voltage in the range of 30 Kev to 80 Kev with a dosage in the range of 1E12 to 1E13.

10. The method of claim 5 wherein said N type impurity ion is Phosphorus or, Arsenic.

11. The method of claim 10 wherein said N type ion is implanted at an acceleration voltage in the range of 30 Kev to 80 Key with a dosage in the range of 1E12 to 1E13 atoms/cm$^2$.

* * * * *